United States Patent [19]

Sanders

[11] 4,045,259

[45] Aug. 30, 1977

[54] PROCESS FOR FABRICATING DIFFUSED COMPLEMENTARY FIELD EFFECT TRANSISTORS

[75] Inventor: Thomas J. Sanders, Indiatlantic, Fla.

[73] Assignee: Harris Corporation, Cleveland, Ohio

[21] Appl. No.: 735,285

[22] Filed: Oct. 26, 1976

[51] Int. Cl.² .......................................... H01L 21/225
[52] U.S. Cl. ................................... 148/188; 148/187; 148/189
[58] Field of Search ............... 148/187, 1.5, 189, 188; 29/571; 357/42

[56] References Cited

U.S. PATENT DOCUMENTS

| 3,614,829 | 10/1971 | Burgess et al. | 29/571 |
| 3,700,507 | 10/1972 | Murray | 148/187 |
| 3,750,268 | 8/1973 | Wang | 29/571 |
| 3,759,763 | 9/1973 | Wang | 148/188 |
| 3,806,371 | 4/1974 | Barone | 148/1.5 |
| 3,821,781 | 6/1974 | Chang | 357/44 |
| 3,837,935 | 9/1974 | Maeda | 148/187 |
| 3,865,654 | 2/1975 | Chang et al. | 148/187 |
| 3,892,609 | 7/1975 | Coppen | 148/188 |
| 3,912,559 | 10/1975 | Harigaya et al. | 148/187 |
| 3,921,283 | 11/1975 | Shappir | 29/571 |

*Primary Examiner*—G. Ozaki
*Attorney, Agent, or Firm*—Leitner, Palan & Martin

[57] ABSTRACT

In a process for fabricating complementary FETS, wherein a first insulative layer has apertures therein, a second insulative layer doped with N-type impurities is formed over the area in which an N channel device is to be formed and is diffused in a non-oxidizing atmosphere through apertures in the first insulative layer to form the source and drain of an N channel device. Immediately thereafter, an atmosphere containing a P-type impurity is introduced to deposit and diffuse P-type impurities through exposed apertures in the first insulative layer to form the source and drain of a P channel device.

14 Claims, 4 Drawing Figures

PROCESS FOR FABRICATING DIFFUSED COMPLEMENTARY FIELD EFFECT TRANSISTORS

BACKGROUND OF THE INVENTION

1. Field of the Invention

The present invention relates generally to a method for forming complementary field effect transistors and more specifically to an improved method for forming complementary metal oxide semiconductor (CMOS) devices using a doped insulative layer and an impurity containing atmosphere in a double diffusion self-aligned process.

2. Description of the Prior Art

Processes for fabricating complementary field effect transistors have used doped glass or oxide as sources of impurities in a single diffusion step to form the self-aligned complementary structures. These processes generally include depositing the doped oxide or glass, performing a masking operation to remove a portion of the first doped oxide, applying a second layer of doped oxide of opposite impurity concentration and simultaneously diffusing the impurities from the doped oxide layers to the substrate. Sometimes an additional step placing a protective layer over the doped oxide layers to prevent out diffusion is included.

Other processes of forming simultaneously P and N type areas in a substrate have applied a glass or silicon dioxide doped region, delineated the region, and diffused from the doped layer simultaneously with vapor deposition and diffusion of impurities of opposite conductivity types. As with the previous process, the diffusion of the impurities into the substrate of both impurity types are performed simultaneously. In both of the two mentioned processes, since this diffusion of the impurities of opposite conductivity type are performed simultaneously, the choice of impurities are limited to dopants which have the same coefficient of diffusion. Thus the choice of impurities are restricted to boron and phosphorus.

Similarly, by simultaneous diffusion of dopants with opposite conductivity type, some protective measure must be taken to prevent the interaction of the dopants. As mentioned previously, additional method steps including a protective coating over the glass or silicon dioxide doped layer must be provided. Each additional process step, or movement of the composite structure between steps, increases the time and cost of production. Simultaneous diffusion also prevents individual control of the N-type and P-type region depths.

SUMMARY OF THE INVENTION

The process of the present invention simplifies the method of forming complementary field effect transistors by reducing the number of steps and composite structure manipulations. In a standard process for forming complementary field effect transistors wherein apertures are provided in a first insulative layer, serving as a mask, to expose the areas in which the complementary field effect transistors are formed and having the gates dividing the source and drain areas, a second insulative layer doped with N-type impurities is formed thereon. A single masking step is used to remove the second insulative layer from the area in which the P-channel devices are to be formed. The composite structure is then placed in a diffusion furnace whereiin the N-type impurities are diffused in a non-oxidizing atmosphere through apertures in the first insulative layer to form the source and drain regions of an N channel device. Next, the compositie is subjected to an atmosphere having P-tye impurities to deposit and diffuse P-type dopants through the exposed apertures in the first insulative layer to form the source and drain of a P channel device. The second diffusion further diffuses the N channel source and drain regions to their final depth. The N-type impurities have a slower coefficient of diffusion in the substrate than the P-type impurities so as to insure the complementary nature of the field effect transistors. The second diffusion may be performed in the same furnace as the first, or two separate furnaces may be used.

OBJECTS OF THE INVENTION

An object of the present invention is to provide an improved method for making field effect transistors.

Another object of the invention is to provide a more economical process for forming all diffused, self-aligned CMOS structures.

A further object of the present invention is to provide a process for forming CMOS's using a single masking step for diffusion from a doped insulative layer and from a dopant containing atmosphere using two diffusion steps.

Still another object is to provide a process for doubly diffused CMOS devices which allows the use of a wide range of dopant materials and better control of source and drain depths.

Other objects, advantages, and novel features of the present invention will become apparent from the following detailed description of the present invention when considered in conjunction with the accompanying drawings.

DESCRIPTION OF THE PREFERRED EMBODIMENTS

The processing for fabricating complementary field effect transistors begins with a silicon wafer 10 of an N conductivity type being doped with phosphorus with an impurity concentration of $1 \times 10^{15}$ carriers per cubic centimeter. Substrate 10 is oxidized to form an insulative silicon dioxide layer 14 and an aperture is formed through which is diffused, for example, P-type impurities to form region 12 having a depth of approximately three microns and a sheet resistance of 6,000 ohms per square.

Figure 1:
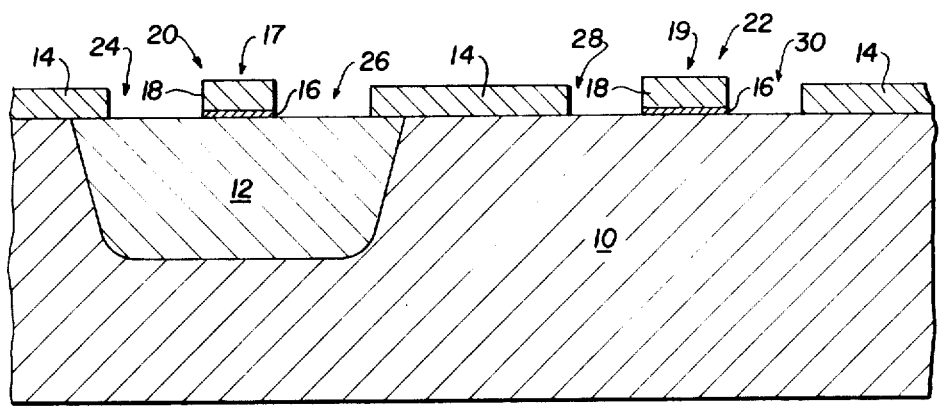
FIG. 1 through 4 are sectional views showing the various steps of the method embodying the present invention for making a pair of complementary field effect transistors.

A second silicon dioxide layer 16 is grown over the substrate and a layer 18 of polysilicon is formed over the silicon dioxide layer 16. The layers 16 and 18 are masked and etched to form the polysilicon gate 17 for the N channel device 20 and gate 19 for the P channel device 22. It should be noted that the polysilicon gate structure is only one of many gate structures which may be formed. Other gate structures may include silicon nitride insulation layers and metallic or other highly conductive gate layers. The silicon dioxide layer 14 and gate layers 16 and 18 form a mask for a self-align process having source and drain apertures 24, 26, 28 and 30 for the N and P channel devices 20 and 22 respectively. The structure at this point in the process is illustrated in FIG. 1 wherein the silicon dioxide layer 14 is 0.6 microns thick, the silicon dioxide layer 16 is 0.08 microns thick and the polysilicon layer 18 is 0.6 microns thick. The use of these materials and their thicknesses are merely examples. These processing steps are well-known in the art and are not considered part of the present invention. Any process steps may be used to provide the structure of FIG. 1.

In practicing the improved methods of the present invention a layer of insulative 32 having N type impurities is formed unselectively over the entire structure of FIG. 1. Doped insulative layer 32 may be glass composition or silicon dioxide doped with N-type impurities. The glass or silicon dioxide can be formed by spinning a suspension of glass in a liquid on the composite structure and heating to fuse the particles. Alternatively, the glass containing the dopant can be deposited by pyrolytic deposition techniques, sputter deposition, or paint-on techniques. A masking step is then performed to remove the doped layer 32 from the area in which the P channel device 22 is to be formed. The final structure after this process step is illustrated in FIG. 2 wherein the doped layer 32 has a thickness, for example, of one mircon.

Figure 2:
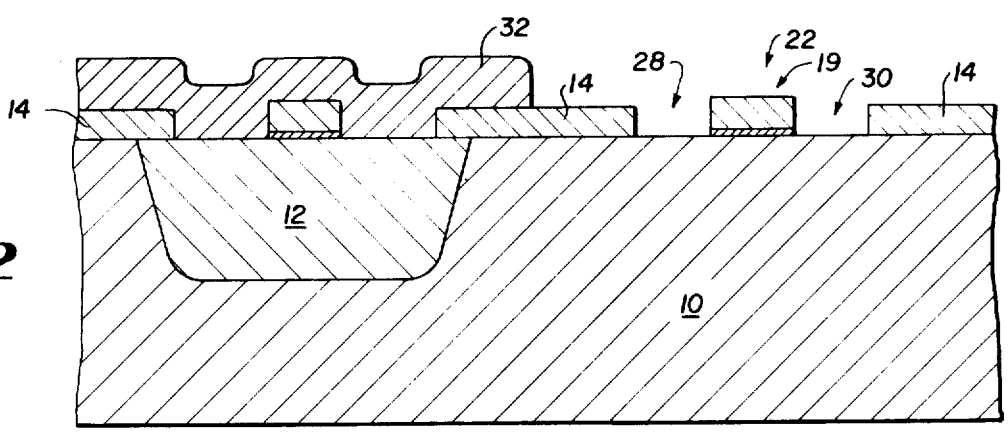
Figure 3:
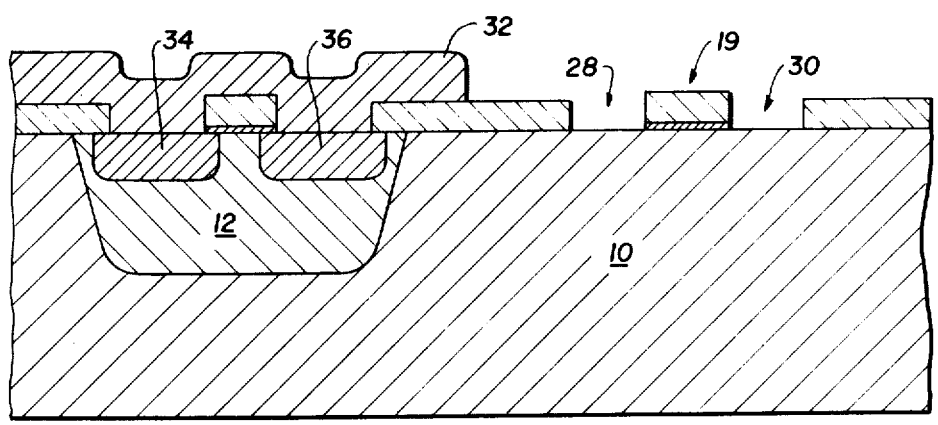
Figure 4:
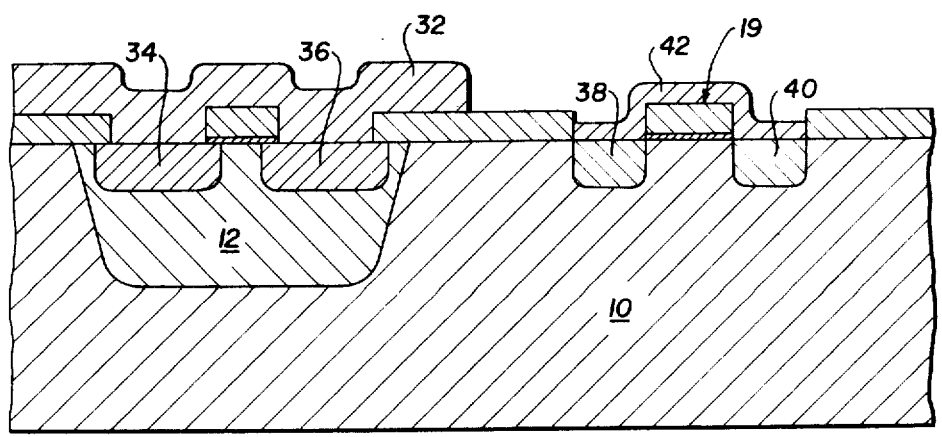

The composite structure of FIG. 2 is then placed in a diffusion furnace wherein the N-type impurities in layer 32 are diffused into the P-type region 12 through apertures 24 and 26 in the insulative silicon dioxide layer 14 to initially diffuse the source and drain regions 34 and 36 of the N channel device 20. The structure at this point is illustrated in FIG. 3 wherein the N-type impurity selected is arsenic and the source and drain regions have a depth of approximately 0.85 micron with a sheet resistance of 25 ohms per square. The diffusion of the arsenic from the doped oxide layer 32 is at, for example, 1150° C for a time of approximately 1 hour.

The diffusion of the N-type impurities from doped layer 32 is performed in a nonoxidizing atmosphere. This atmosphere may be, for example, nitrogen. By performing the diffusion in a non-oxidizing atmosphere, no oxide is formed in the apertures 28 and 30 for the P channel device 22. Therefore, elimination of additional step or steps of removing the oxide from the apertures 28 and 30 is accomplished. Also, by diffusing regions 34 and 36 to near their final depth before the P-type diffusant is introduced, separate control of the final depths of the source and drain regions of both devices is attained, which better controls the length of the devices.

Immediately following the diffusion of the N-type impurities from the doped insulative layer 32 and without removing the composite structure from the diffusion furnace, an atmosphere containing P-type impurities is substituted for the nonoxidizing atmosphere to diffuse P-type impurities through exposed apertures 28 and 30 into substrate 20 to form source and drain regions for P channel device. Boron, which may be used as a P-type impurity, is deposited at 970° C for about 20 minutes and diffused at 1100° C for 40 minutes to form source and drain regions 38 and 40 having a depth of one micron and a sheet resistance of 100 ohms per square. Although the use of a single furnace for both diffusion minimizes the manipulative steps of the process, the composite structure could be removed from the first furnace after the first diffusion and placed in a second furnace for the P-type deposition and subsequent diffusion.

During this subsequent or second diffusion, a silicon dioxide insulative layer 42 is formed over the P-type regions 38 and 40 and gate 19, having a thickness of approximately 0.4 microns. Insulative layer 32 is increased during the formation of layer 42, but not increased sufficiently to illustrate. This last diffusion step not only diffuses the source and drain regions 38 and 40 of the P channel device, but also further diffuses the source and drain region 34 and 36 of the N channel device to a final depth of one micron.

Since the N-type impurities are diffused for approximately twice the amount of time of the P-type impurities, the N-type impurities must diffuse at a slower rate than the P-type impurities. Since arsenic diffuses slower than boron, their choice as N- and P-type impurities respectively was made. It should be noted that other choices of impurities are available, for example, antimony may be substituted for arsenic and gallium may be substituted for boron. Since boron and phosphorus diffuse at substantially the same rate, their choice as P- and N-type impurities cannot be used in combination in the present method. It should be noted though that phosphorus may be used with a P-type impurity of a faster diffusion rate, for example, gallium or aluminum. The combination of P- and N-type impurities are limitless as long as the impurity can be properly blocked by the silicon dioxide functioning as a mask. This provides an advantage over the prior art wherein simultaneous diffusion restrict the use of N-tye impurity to phosphorus and P-type impurity to boron. Similarly, since the N-type impurity was first diffused from the doped insulative layer 32 into the substrate, no protective layer was needed for the insulative layer 32. Similarly, since insulative layer 32 was predeposited upon the substrate, no additional oxidation was needed to form the insulative layer covering the N channel device through which metal contacts may be made. The diffusion time and temperature may be varied and are dependent upon the impurities used.

The process of fabricating complementary field effect transistors using a totally diffused, self-aligning technique reduces the number of process steps and length of fabrication without sacrificing the quality and reliability of the final structure. The present process uses a single masking step from the application of the doped insulative layer to the final diffusion in a double diffused, self-aligned technique. Not removing the composite structure from the diffusion furnace between the N-type deposition and delineation and the P-type deposition greatly increases the speed at which the device may be produced. Similarly, the mere substitution of atmosphere in the diffusion furnace allows for a more even control of the temperature over prior methods which required removing of the composite structure to prepare it for the second diffusion.

From the preceding description of the preferred embodiments, it is evident that the objects of the invention are obtained. Though the invention has been described in detail, it is clearly understood that the same is by way of illustration and example only. The materials used, the impurity concentrations, and the dimensions of the specific areas are by way of example only. Similarly, a P-type substrate may be used with an N-type pocket therein. The essence being that the N-type impurity be diffused prior to diffusing the P-type impurity to form the source and drain of the MOS. The spirit and scope of this invention are limited only the terms of the appended claims.

What is claimed:

1. In a process for fabricating complementary field effect transistors wherein source and drain apertures are provided through a first insulative layer superimposed on a substrate and each source and drain aperture are separated by a gate superimposed on said substrate, the improvement comprising:

forming unselectively a second insulative layer doped with N-type impurities;

selectively removing a portion of said second insulative layer to exposed apertures in which a P channel device is to be formed;

diffusing said N-type impurities from said second insulative layer into said substrate in a nonoxidizing atmosphere to form an N channel device; and subsequently changing said nonoxidizing atmosphere to an atmosphere containing P-type impurities to diffuse P-type impurities through said exposed apertures to form said P channel device and further diffuse said N-type impurities.

2. The process of claim 1 wherein said N-type and P-type diffusion steps are performed in sequence without intervening steps.

3. The process of claim 2 wherein said N-type and P-type diffusion steps are performed in a diffusion furnace without removing the composite structure said furnace between diffusion steps.

4. The process of claim 1 wherein said N-type impurity has a slower coefficient of diffusion in said substrate than said P-type impurity.

5. The process of claim 4 wherein said N-type impurity is arsenic and said P-type impurity is boron.

6. The process of claim 1 wherein said first N-type diffusion step is performed in a first diffusion furnace and said P-type diffusion step is performed in a second diffusion furnace.

7. In a process for fabricating complementary field effect transistors by diffusion to form the source and drain regions in a substrate, the improvement comprising:

forming a masking layer on said substrate with apertures to expose the areas of said substrate in which said source and drain regions are to be formed;

forming an insulative layer doped with N-type impurities over the area in which the source and drain regions of an N channel device is to be formed;

diffusing in a nonoxidizing atmosphere said N-type impurities from said doped insulative layer into said substrate to form said N channel device; and immediately thereafter introducing a P-type impurity atmosphere to diffuse P-type impurities through exposed apertures to form a P channel device.

8. The process of claim 7 wherein said doped insulative layer is formed by non-selectively forming said doped insulative layer on said masking layer and then removing a portion of said doped insulative layer to expose the apertures in which said P channel device is to be formed.

9. The process of claim 7 wherein said masking layer is a first insulative layer on said substrate having source and drain apertures, said doped insulative layer is a second insulative layer covering said source and drain regions and the gate of said N channel devices, and a third insulative layer is formed covering said source and drain regions and the gate of said P channel device during the final diffusion step.

10. The process of claim 7 wherein said N-type and P-type diffusion steps are performed in sequence without intervening steps.

11. The process of claim 10 wherein said N-type and P-type diffusion steps are performed in a diffusion furnace without removing the composite structure from said furnace between diffusion steps.

12. The process of claim 7 wherein said N-type impurity has a slower coefficient of diffusion in said substrate than said P-type impurity.

13. The process of claim 7 wherein said masking layer is an insulative layer on said substrate with openings to expose the area in which the N and P channel devices are to be formed and a gate on said substrate in said openings to define said apertures for said source and drain areas.

14. The process of claim 7 wherein said first N-type diffusion step is performed in a first diffusion furnace and said P-type diffusion step is performed in a second diffusion furnace.

* * * * *